(12) United States Patent
Meulenbroeks

(10) Patent No.: US 7,242,719 B2
(45) Date of Patent: Jul. 10, 2007

(54) METHOD AND APPARATUS FOR SPACE-SAVING-VARIABLE LENGTH ENCODING AND DECODING

(75) Inventor: Franciscus Johannes Henricus Maria Meulenbroeks, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 683 days.

(21) Appl. No.: 10/182,158

(22) PCT Filed: Dec. 5, 2001

(86) PCT No.: PCT/IB01/02307

§ 371 (c)(1),
(2), (4) Date: Jul. 25, 2002

(87) PCT Pub. No.: WO02/47275

PCT Pub. Date: Jun. 13, 2002

(65) Prior Publication Data

US 2003/0001758 A1    Jan. 2, 2003

(30) Foreign Application Priority Data

Dec. 6, 2000 (EP) .................... 00204352

(51) Int. Cl.
*H04B 14/04* (2006.01)

(52) U.S. Cl. .................... 375/253; 375/246; 341/67; 341/65

(58) Field of Classification Search ............. 375/240, 375/253, 242, 246, 244; 341/51, 59, 23, 341/65, 67
See application file for complete search history.

(56) References Cited

U.S. PATENT DOCUMENTS 6,292,883 B1 * 9/2001 Augusteijn et al. ......... 712/209
6,642,860 B2 * 11/2003 Meulenbroeks ............. 341/51

OTHER PUBLICATIONS

Bell et al., "Text Compression," Prentice Hall PTR, Englewood Cliffs, New Jersey, 1990, pp. 105-107.

* cited by examiner

*Primary Examiner*—Dac Ha
*Assistant Examiner*—Jaison Joseph

(57) ABSTRACT

A sequence of input information items is space-saving-encoded into variable-length code bit groups. Each information item is mapped on an associated code bit group of a set of bit groups, wherein the bit groups have particular lengths that are non-uniform in the set. The code bit groups are chained into a chaining configuration of bit groups while allowing progressive delimiting of successive bit groups. For regressive delimiting of successive bit groups, each bit group as divided into an idiosyncratic sequence of subgroups. In each sequence, the subgroups are assigned to a respective sub-chainings. The sub-chainings are configured into respective sub-chaining configurations, while maintaining pointer information regarding each respective sub-chaining configuration to preserve mutual synchronization among the various sub-chaining configurations regarding the associated in formation items.

12 Claims, 4 Drawing Sheets

| A | B | C | | | D | | | |
|---|---|---|---|---|---|---|---|---|
| .2 | a | 0 | 1 | | 1 | 0 | | |
| .3 | e | 0 | 0 | | 0 | 1 | | |
| .1 | i | 1 | 0 | 1 | 0 | 0 | 1 | |
| .2 | o | 1 | 0 | 0 | 1 | 1 | | |
| .1 | u | 1 | 1 | 0 | 0 | 0 | 0 | 0 |
| .1 | ! | 1 | 1 | 1 | 0 | 0 | 0 | 1 |

FIG. 3 (PRIOR ART)

| A | | | B | | | C |
|---|---|---|---|---|---|---|
| 0 | 0 | 0 | 0 | | | 1/2 |
| 0 | 0 | 1 | 1 | 0 | 0 | 1/8 |
| 0 | 1 | 0 | 1 | 0 | 1 | 1/8 |
| 0 | 1 | 1 | 1 | 1 | 0 | 1/8 |
| 1 | 0 | 0 | 1 | 1 | 1 | 1/8 |

FIG. 4

METHOD AND APPARATUS FOR SPACE-SAVING-VARIABLE LENGTH ENCODING AND DECODING

BACKGROUND OF THE INVENTION

The invention relates to a method for space-saving-variable length encoding. The input information items may represent characters, bytes, words, microprocessor instructions, etc. They may have uniform lengths or not. The principle of the encoding is that certain information items occur more frequently than others, so that mapping the former on relatively short code bit groups will diminish the overall amount of code bits. The technology for this mapping has been well known in the art. For progressive decoding, a particular code bit group is delimited in the stream of coded bits, decoded, and then the beginning of the next code bit group will be instantly visible. The decoding then becomes a straightforward job. In fact, the selecting of the various code bit groups has been designed in such way that the above delimiting is always easy; naturally, this is done for the most probable direction of the encoding, such as forward in the flow of time when encoding a more or less continuous signal such as speech. Regressive decoding, on the other hand, is less simple, because the delimiting of a single code bit group in this direction is often impossible through the particular selecting strategy. In principle, a trial and error regressive procedure may have a high probability for success, but any failure in delimiting a single code bit group will force the decoding to go back still further. In fact, both the larger decoding delay itself and the spread in the decoding delay are detrimental to the overall expediency of the decoding process.

SUMMARY TO THE INVENTION

Now, the present inventor has recognized that dividing the code bit groups in respective subgroups and assigning these to respective sub-chainings, whilst maintaining for each sub-chaining a separate pointer mechanism, will allow the decoding process to execute regressive decoding without the need to delimit the coded bit groups in a trial and error procedure. Therefore, regressive decoding may proceed in a similarly expeditious manner as progressive decoding. Each code bit group is distributed in an idiosyncratic manner that for each code bit group content is always the same, but may vary among various such identities.

In consequence, amongst other things, it is an object of the present invention to use separate pointers for the respective sub-chainings of bits so that the regressive decoding may step instantaneously to a next appropriate starting point.

The invention also relates to an apparatus arranged for encoding a sequence of input information items into variable length code bit groups and the providing of separate pointers for the respective subgroups of code bits, to an apparatus arranged for decoding a sequence of such variable-length code bit groups, and to a medium comprising data so encoded.

BRIEF DESCRIPTION OF THE DRAWING

These and further aspects and advantages of the invention will be discussed more in detail hereinafter with reference to the disclosure of preferred embodiments, and in particular with reference to the appended Figures that show:

FIG. 1, an example of generating a set of code bit groups;
FIG. 2, the formation of sub-groups and pointers;
FIG. 3, further examples of forming code bit groups;
FIG. 4, a still further example of forming code bit groups.

DETAILED DESCRIPTION OF PREFERRED EMBODIMENTS

Figure 5:
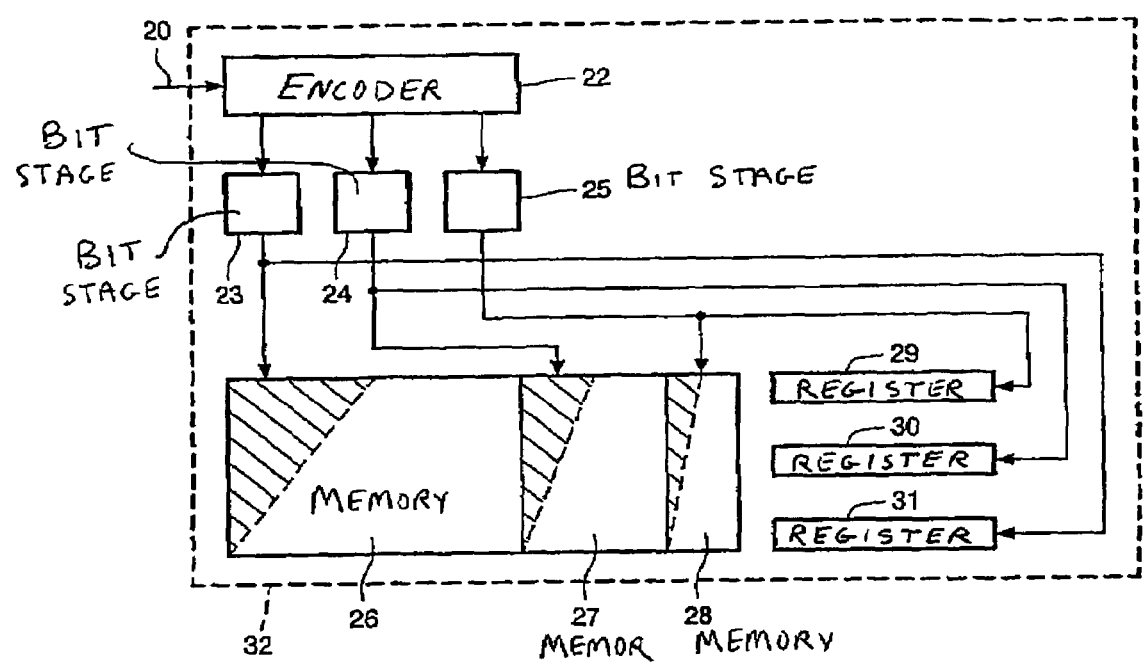
FIG. 5, a conceptual apparatus arrangement for forming sub-groups and pointers.

FIG. 1 shows an example of generating a set of code bit groups. In the example, the left hand column A has four unique information items of two bits each. For each information item, the right hand column B contains a corresponding code bit group. Assuming the occurrence probability for the successive items at left to be ½, ¼, ⅛ and ⅛, respectively, shows an overall diminishing of the number of bits through coding by a factor of ⅞. Other probability distributions and code mappings may produce greater or lesser savings. The decoding in a progressive direction from left to right may take a simple road: either the next code bit group terminates with the next "0" bit, or the next code bit group is made up from three "1" bits. Decoding in a regressive direction from right to left is more complex however, because it must by necessity go back to the first "0" bit occurring, and may therefrom only decode the code bit groups to the right thereof. Going further to the left again will require executing the same procedure again. In the case of other, possibly more complex mappings, the problem may aggravate appreciably. A few, still elementary, code mappings have been illustrated in FIGS. 3 and 4. Many practical applications use much larger sets of information groups, causing the problem solved herein to grow by orders of complexity.

FIG. 2 shows the formation of sub-groups and pointers for use with the present invention. Row A gives an exemplary sequence of code bit groups, formed according to the principle disclosed with respect to FIG. 1. Part B of the Figure has each code bit group conceptually arranged in a single column. For each code bit group, the leftmost bit is entered into the lowest row, the second bit if present from left in the middle row, and the third bit if present from left in the top row. This assigning of the leading bit to the lowest row will render it simple to assign a bit position in the lowest row to a particular code bit group. However, various other strategies for such assigning appear feasible for attaining the same or a comparable result.

Furthermore, for each row the number of bits is counted separately and stored in an associated pointer register P1, P2, P3, which registers have the lowest significance bit in the right-most position, so that in the example the counts are thus 5, 2, and 1, respectively. The decoding (regressive, but progressive decoding must generally be done in the same way also) is effected through accessing a particular bit on the lowest row, as indicated by pointer P1 that effectively indicates the code bit group number. The value of the latter bit indicates whether a code bit from the middle row, as well as whether a further code bit from the top row must be taken into account for the decoding. The pointers for the other rows will then indicate which address to access. For the specific example presented here, when going 10 code bit groups to the left P1:=(P1−10), the decrement in P2 is generally less: P2:=(P2−10+$N_0$), wherein $N_0$ is the number of zeroes in the lowest row in the interval between the two values of P1. For P3 a similar procedure applies. Other assignment patterns and other codes as will be discussed hereinafter will need other schemes in the decrementing, but all pointers must be stepped systematically, as based on the earlier parts of the symbols in question.

Obviously, full regressive decoding requires to step back by only one bit position in the lowest row. In principle, the assignment pattern of the code of FIG. 1, as regarding the successive bits in a code bit group to the respective rows may be non-uniform, but this may complicate the algorithm. However, doing such may distribute the assignment load across the rows in a more even manner. The same arrangement of FIG. 2 may be used for progressive decoding. Through the pointers per row, the mutual synchronization among the various sub-chaining configurations of the three rows is maintained as regarding the associated information items. If two rows have identical pointer values, they may have their pointers combined.

FIG. 3 illustrates two further examples of forming code bit groups, that have been taken from the book "TEXT COMPRESSION" by Timothy C. Bell et al, Prentice Hall PTR, Englewood Cliffs N.J. 07632 USA, 1990, in particular pages 105–107. Column A has the occurrence probabilities for the five symbols in column B. Column C has the code bit groups of a Shannon/Fano code, and column D for a Huffman code. Page 106 illustrates progressive decoding for the Huffman code through using a search tree: as soon as an information item has been decoded, the decoding of the next code bit group may start, without having to know its length in advance. Of course, the progressive decoding may also proceed through using a look-up table. In contradistinction, regressive decoding must generally know the delimiting of the code bit group at the left end, which in fact will become known only after the decoding has been executed.

Here, the decoding compares to the one discussed with reference FIG. 2. For Shannon/Fano, the value of the leading bit determines whether the upper pointer must step (first bit is 1), or whether no bit associated to the upper pointer need be taken into consideration. In this example, in effect only two pointers are necessary. For Huffman, at least one "1" bit in the first two bits indicates that the code bit group has only two bits. With both bits "0", the code bit group is longer.

FIG. 4 illustrates a still further example of forming the code bit groups in column B from the five information bit groups in column A. The occurrence probabilities are in column C. Also here, regressive decoding must know the left hand end (in the form wherein the code words have been shown) of the code bit group before the decoding can start. Through using the pointers, this becomes straightforward: if the first pointer indicates a "1", then the code bit group is three bits, otherwise only one bit.

FIG. 5 shows a conceptual apparatus arrangement for forming sub-groups and pointers. Input 20 receives the various information items. Element 22 contains a relevant registry device and encoder, outputting the respective code bits to bit stages 23, 24, 25, respectively, for example through stage 23 always receiving the leftmost code bit in FIG. 1. The various code bits are then stored in respective storage arrays 26, 27, 28, such as RAM. As shown by hatching, these arrays are partially filled. Registers 29, 30, 31 are associated to the various storage arrays to indicate the degree of filling. The overall arrangement is comprised in synchronization region 32, such being effected through clock means not shown for brevity.

Alternatively, the assigning in block 22 may be effected on a probability-based method: a first pass of all information items will produce the best assigning map, whereas the second pass effects the mapping proper.

Figure 6:
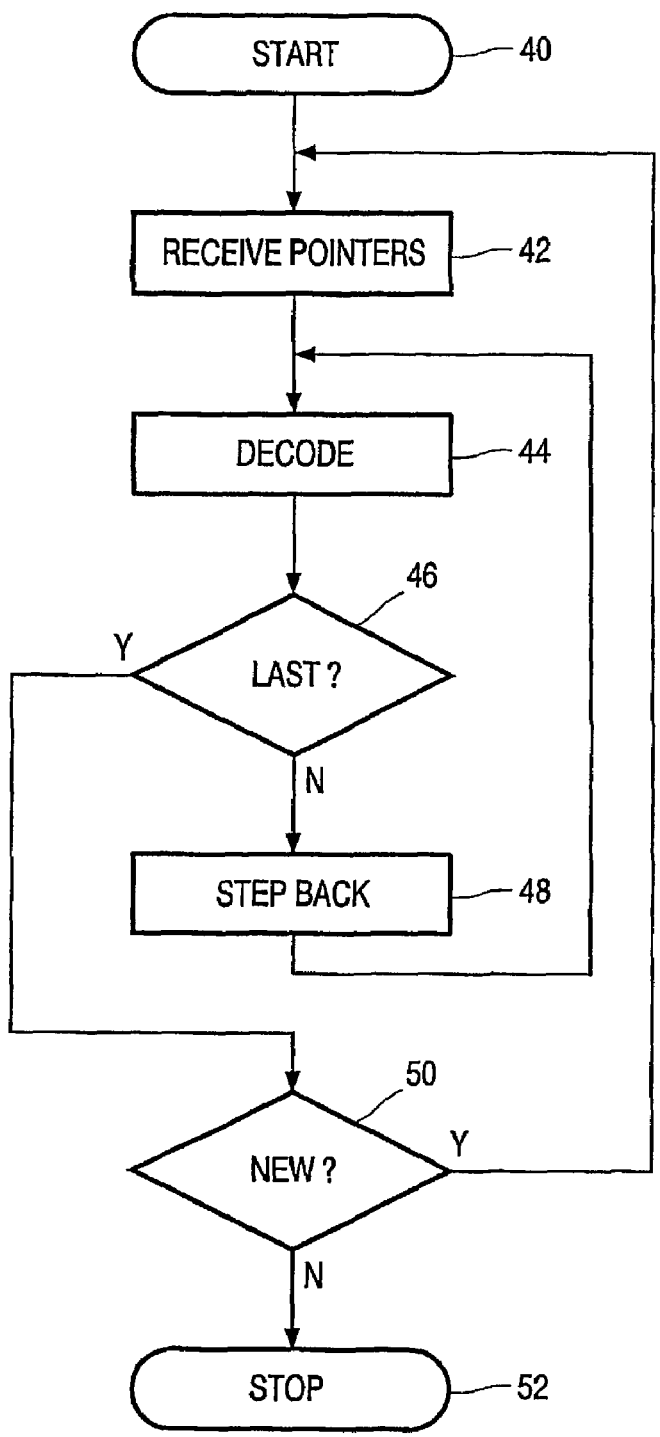
FIG. 6, a decoding flow chart.

FIG. 6 illustrates a decoding flow chart for the present invention. In block 40, the procedure begins, and the necessary hardware and software facilities are assigned. In block 42, the necessary pointers are received from a control mechanism not shown. For example, there may be provided various sets of pointers, each for a relatively large block of storage space. In block 44, the first code bit group is decoded. In block 46, the system detects whether the actual code bit group has been the last one. If not, the pointers are stepped back or decremented according to the principles discussed supra, block 48, which is determined for each bit separately. Next, the system returns to block 44. If actually the last bit group to be decoded, the system goes to block 50 and determines whether any further set of pointers has been waiting. If yes, the system goes back to block 42. If no, the system goes to block 52 and relinquishes the facilities that had been assigned earlier in block 40 and the procedure terminates.

As discussed hereabove, the subgroups of a particular bit group need not have uniform size. In FIG. 3C, the first subgroup may have two bits, the second only one. In FIG. 3D, the first subgroup may have two bits, the second and third subgroups only one each. In FIG. 4, the first subgroup may have one bit, the second subgroup two bits. Furthermore, in principle, the subgroups of like rank within each bit group need not all have the same lengths. The assigning of the subgroups to a particular sub-chaining (the rows in FIG. 2B) need not be steady. For example, the assigning might rotate, such that successive code bit groups in FIG. 2B have their first subgroups assigned successively to third, second, first, third rows, etcetera. The proposed strategy of the present invention lends itself to various different applications. While so encoding a microprocessor instruction set, will allow the control system to jump backwards in the compressed stream over a chosen number of instructions. If preferred, intermediate pointers may be made available by separately storing them on the storage medium. In fact, the required space therefore is minimal. The information items may be data to be subjected to interpretation, such as used in a finite state machine. Another application would be the encoding of an audio/video signal that now may straightforwardly be subjected to reverse functions, such as reverse play, fast rewind, and the like. Furthermore, the technique allows the compression of information strings through a "pointer+length" strategy wherein the pointer will point to earlier compressed data. Such feature of the present invention may be relevant for embedded systems that have textual user interfaces or that use data that is subject to interpretation operations, such as Television Sets, Portable Telephones, Personal Digital Assistants, Online Help, and other.

The invention can be summarized as follows. A sequence of input information items is space-saving-encoded into variable-length code bit groups. Each information item is mapped on an associated code bit group of a set of bit groups, wherein the bit groups have particular lengths that are non-uniform in the set. Next, the code bit groups are chained into a chaining configuration of bit groups whilst allowing progressive delimiting of successive bit groups. In particular, for allowing regressive delimiting of successive bit groups each bit group is divided into an idiosyncratic sequence of subgroups. In each sequence the subgroups are assigned to a respective sub-chainings. The sub-chainings are configured into respective sub-chaining configurations, whilst maintaining pointer informations regarding each respective sub-chaining configuration to preserve mutual synchronization among the various sub-chaining configurations regarding the associated in formation items.

The invention claimed is:

1. An encoding method for space-saving-encoding of a sequence of input information items, said method comprising the acts of:
   mapping each information item on an associated code bit group of a set of variable-length code bit groups;
   chaining said code bit groups into a chaining configuration of code bit groups whilst providing means for allowing progressive delimiting of successive code bit groups;
   allowing regressive delimiting of successive code bit groups through dividing each code bit group into a sequence of code bit subgroups and in each sequence assigning the code bit subgroups to respective sub-chainings; and
   configuring the sub-chainings into respective sub-chaining configurations, whilst maintaining pointer informations regarding each respective sub-chaining configuration to preserve mutual synchronization among the various sub-chaining configurations regarding the associated information items.

2. The method as claimed in claim 1, wherein at least one code bit subgroup consists of a single bit.

3. The method as claimed in claim 1, wherein all code bit subgroups consist of a single bit.

4. The method as claimed in claim 1, wherein each code bit group uniformly has at least one bit assigned to a particular sub-chaining of code bit subgroups.

5. The method as claimed in claim 2, wherein regarding to a single information item a next subgroup of its code bit group has no higher number of bits than a preceding one.

6. The method as claimed in claim 1, wherein the method is applied to an embedded system that has a textual interface, or is applied to a processor instruction set, or is applied to data subject to interpretation, or is applied to an audio/video signal.

7. The method as claimed in claim 1, further comprising the act of storing or transmitting data so encoded, and thereto joining a set of said pointer informations.

8. An encoding apparatus being arranged for space-saving-encoding of a sequence of input information items said apparatus comprising:
   mapping means for mapping each information item on an associated code bit group of a set of variable length code bit groups,
   chaining means for chaining said code bit groups into a chaining configuration whilst providing means for allowing progressive delimiting of successive code bit groups,
   means for allowing regressive delimiting of successive code bit groups comprising dividing means for regressive delimiting successive code bit groups by dividing each bit group into an sequence of subgroups;
   assigning means for in each sequence assigning the subgroups to respective sub-chainings;
   and configuring means for configuring the sub-chainings into respective sub-chaining configurations, whilst maintaining pointer informations for each respective sub-chaining configuration to preserve mutual synchronization among the various sub-chaining configurations regarding the associated information items.

9. The apparatus as claimed in claim 8, wherein at least one code bit subgroup consists of a single bit.

10. The apparatus as claimed in claim 8, wherein each code bit group uniformly has at least one bit assigned to a particular sub-chaining of code bit subgroups.

11. The apparatus as claimed in claim 8, further comprising means for storing or transmitting data so encoded, and thereto joining a set of said pointer informations.

12. An apparatus being arranged for regressive decoding of a space-saving chaining configuration encoded, said apparatus comprising:
   receiving means for receiving a pointer to said chaining configuration;
   delimiting means for delimiting a particular code bit group;
   and decoding means for decoding a delimited code bit group into an associated information item for outputting,
   said delimiting means comprising:
   primary access means for accessing a first pointer information associated to a first sub-chaining configuration;
   secondary access means fed by said first pointer information and by a code bit sub-group of said first sub-chaining configuration for recursively accessing any other sub-chaining configuration on the basis of an earlier pointer information and a code bit sub-group of an earlier sub-chaining configuration for so reconstituting an associated code bit group for forwarding to said decoding means;
   and stepping means for stepping said first pointer information over a predetermined step.

* * * * *